(12) United States Patent
Bourennane et al.

(10) Patent No.: US 10,199,376 B2
(45) Date of Patent: Feb. 5, 2019

(54) MONOLITHIC CELL FOR AN INTEGRATED CIRCUIT AND ESPECIALLY A MONOLITHIC SWITCHING CELL

(71) Applicants: CENTRE NATIONAL DE LA RECHERCHE SCIENTIFIQUE (CNRS), Paris (FR); INSTITUT NATIONAL POLYTECHNIQUE DE TOULOUSE (I.N.P.T), Toulouse (FR)

(72) Inventors: Abdelhakim Bourennane, Toulouse (FR); Marie Breil-Dupuy, Toulouse (FR); Frederic Richardeau, Flourens (FR); Jean-Louis Sanchez, Escalquens (FR)

(73) Assignees: Centre National de la Recherche Scientifique (CNRS), Paris (FR); Institut National Polytechnique de Toulouse (I.N.P.T.), Toulouse (FR)

( * ) Notice: Subject to any disclaimer, the term of this patent is extended or adjusted under 35 U.S.C. 154(b) by 423 days.

(21) Appl. No.: 14/353,805

(22) PCT Filed: Oct. 9, 2012

(86) PCT No.: PCT/FR2012/052288
§ 371 (c)(1),
(2) Date: Apr. 24, 2014

(87) PCT Pub. No.: WO2013/054033
PCT Pub. Date: Apr. 18, 2013

(65) Prior Publication Data
US 2014/0299916 A1 Oct. 9, 2014

(30) Foreign Application Priority Data
Oct. 10, 2011 (FR) ...................... 11 59137

(51) Int. Cl.
*H01L 21/761* (2006.01)
*H01L 27/08* (2006.01)
(Continued)

(52) U.S. Cl.
CPC .. *H01L 27/0814* (2013.01); *H01L 21/823487* (2013.01); *H01L 27/088* (2013.01); *H01L 27/0817* (2013.01); *H01L 27/0823* (2013.01)

(58) Field of Classification Search
CPC ... H01L 21/331; H01L 21/761; H01L 21/822; H01L 21/8222; H01L 23/40; H01L 27/04;
(Continued)

(56) References Cited

U.S. PATENT DOCUMENTS 3,795,846 A    3/1974   Ogawa et al.
4,278,985 A *  7/1981   Stobbs .................. H01L 23/522
                                                        257/477
(Continued)

FOREIGN PATENT DOCUMENTS

FR    2 729 008    7/1996
FR    2 947 950    1/2011

OTHER PUBLICATIONS

International Search Report dated Dec. 19, 2012, corresponding to PCT/FR2012/052288.

*Primary Examiner* — Mouloucoulaye Inoussa
(74) *Attorney, Agent, or Firm* — Young & Thompson

(57) ABSTRACT

A cell includes at least two semiconductor structures of the same nature, these two structures both employing voltages and currents that are unidirectional, each structure having an anode (10), a cathode (14) and optionally a gate (16). The structures are integrated into the volume of one and the same semiconductor substrate (4). The cathodes (14), and possibly the gates (16), are arranged on a first side of the semiconductor substrate (4). The anodes (10) are each arranged on
(Continued)

a second side of the semiconductor substrate (4), which side is opposite the first side, facing the cathodes and possibly the corresponding gates. Two electrodes, anodes or cathodes, of two separate structures, are electrically connected to each other.

20 Claims, 12 Drawing Sheets

(51) Int. Cl.
  *H01L 21/8234* (2006.01)
  *H01L 27/082* (2006.01)
  *H01L 27/088* (2006.01)

(58) Field of Classification Search
  CPC ......... H01L 27/06; H01L 27/08; H01L 29/73; H01L 29/732; H01L 29/739; H01L 29/74; H01L 29/78; H01L 29/861; H05K 7/20
  USPC ....... 257/140, 329, 601, 173, 107, 119, 121, 257/544, 547, 909
  See application file for complete search history.

(56) References Cited

U.S. PATENT DOCUMENTS

| | | | |
|---|---|---|---|
| 5,393,995 A * | 2/1995 | Nakagawa | H01L 29/7416 257/147 |
| 5,464,994 A * | 11/1995 | Shinohe | H01L 29/42308 257/147 |
| 6,017,778 A * | 1/2000 | Pezzani | H01L 21/761 257/E21.544 |
| 6,075,277 A | 6/2000 | Pezzani | |
| 6,180,966 B1 * | 1/2001 | Kohno | H01L 29/7397 257/173 |
| 6,256,209 B1 * | 7/2001 | Gurwicz | H02M 1/4258 363/17 |
| 2008/0135932 A1 | 6/2008 | Ozeki et al. | |
| 2010/0219785 A1 * | 9/2010 | Hirose | H01L 27/0658 318/519 |
| 2010/0301410 A1 * | 12/2010 | Hirler | H01L 29/7813 257/334 |
| 2010/0308370 A1 * | 12/2010 | Hshieh | H01L 29/0619 257/136 |
| 2012/0025874 A1 * | 2/2012 | Saikaku | H01L 29/1095 327/109 |
| 2012/0112366 A1 | 5/2012 | Crebier | |

\* cited by examiner

MONOLITHIC CELL FOR AN INTEGRATED CIRCUIT AND ESPECIALLY A MONOLITHIC SWITCHING CELL

FIELD OF THE INVENTION

The present invention relates to a monolithic cell for an integrated circuit and in particular a monolithic commutation cell and applications using at least one such cell.

BACKGROUND OF THE INVENTION

The field of the present invention is power electronics for converting electrical energy between a generator and a receiver, which are generally of different types. It is then necessary to adapt the characteristics and the different forms of electrical energy (direct-current or alternating-current). The electrical converters used are generally produced with switches based on semiconductor components and passive components such inductors or capacitors. Switches, but also diodes, make it possible to control the transfer of electrical energy, whereas the passive components serve for filtering the waveforms of this energy. A switch behaves like a non-linear resistance, which must be as low as possible in the ON state and as high as possible in the OFF state. The converters mentioned here do not use rotating parts and so are also called "static converters".

The use of an insulated gate bipolar transistor, also known by the acronym IGBT, as an electronic switch in circuits for power electronics is known. Such a component allows great simplicity of operation while keeping conduction losses low. The use of such components has enabled many advances in applications of power electronics both with regard to reliability and reduction of costs.

On the basis of components such as for example IGBTs, achievement of power integration by making an assembly of components is known. In this way, standard modules are produced. This technique is commonly used in industry, transport or power engineering. Thus it is known, for example, to integrate within a chip a switching dipole with only two power electrodes, and to implement vertically voltage withstand and current flow within the chip. Such a dipole is commonly called a "switch". Next, energy conversion structures are produced by linking together several switches by wiring, in order to create a structure for energy conversion. This wiring operation creates strong parasitic electrical interactions between the connection inductances, the parasitic capacitances with respect to the ground plane, the semiconductors themselves and their near-control electronics.

These interactions degrade the overall performance of the power converter produced, relative to the performance of the initial components (switches). The wiring operation also limits the reliability of the wired assembly, causing a decrease in service life when high current densities are used, a high ambient temperature and operational thermal cycles. Finally, this operation is costly as it requires a long time for its implementation and thus limits productivity.

Integration of complete control and logic circuits into the silicon, i.e. in one and the same chip, is also known. This is used for example in mass production applications, for example in the automotive industry. Most often, the functions are performed at the surface of the silicon crystal. The voltages involved are therefore limited and such solutions only relate to certain applications.

The present invention has the objective, in the field of power electronics, of allowing even greater miniaturization in order to obtain a converter that is more compact. Preferably, the reliability achieved will also be increased. Moreover, the present invention will advantageously allow the cost of a power converter to be reduced.

For this purpose, an integrated-circuit monolithic cell is proposed comprising at least two semiconductor structures of the same type that are unidirectional in voltage and in current, each structure having an anode, a cathode and optionally a gate.

SUMMARY OF THE INVENTION

According to the present invention, said structures are integrated into the volume of one and the same semiconductor substrate; on a first face of the semiconductor substrate the cathode and optionally the gate of a corresponding structure are located in each case in a first predetermined zone; the anode of each structure is located in a second zone on a second face of the semiconductor substrate opposite the first face, the second zone of a structure being opposite the first zone of the corresponding structure, and the electrodes, selected from the group comprising the anodes and the cathodes, of the same type having separate structures, are electrically connected to each other.

The present invention thus proposes to produce, within one and the same semiconductor device, not just a dipole, such as for example a switching dipole, but a tripole (or quadripole or more) forming a true integrated-circuit cell, no longer limited to a single component. A cell according to the present invention can thus form a true elementary converter, devoid of all wire cabling and having extremely low electrical interactions, simultaneously providing a high level of miniaturization, reduction of costs and high reliability. A device according to the invention can be used for applications using voltages of 230 V/400 V or for industrial applications with voltages of 750 V-850 V Owing to its structure using two monolithic, generic and modular architectures of symmetric cells, the solution proposed by the present invention makes it possible to limit the number of doped layers within the semiconductor device.

According to a first embodiment of an integrated-circuit monolithic cell according to the invention, of so-called common anode type, the anodes of two adjacent structures are electrically connected in each case. In this embodiment, the electrical connection between two adjacent anodes (P+) is carried out by metallization of the semiconductor substrate on its second face between the two anodes, and the semiconductor substrate has an N+ region in the proximity of the metallization, permitting bidirectional conduction of the current by the cell, and an N− region between the two structures.

According to a second embodiment of a monolithic cell according to the present invention, known as the common cathode type, the cathodes of two adjacent structures are electrically connected in each case. It is envisaged here, for example, that a vertical insulating wall of the P+ type is produced between the two structures involved, permitting lateral voltage withstand within the cell.

In a monolithic cell according to the invention, the semiconductor substrate is for example of silicon ($SiO_2$), but other semiconductor materials can also be used.

In a cell according to the present invention, each semiconductor structure corresponds for example to a diode.

In another embodiment of a cell according to the present invention, each semiconductor structure can be a semiconductor switching structure that is unidirectional in voltage and in current. As a variant of this embodiment, each structure can also be provided with at least one control electrode. Still in this embodiment, it can be envisaged alternatively or cumulatively that each cell is associated in the crystal with a diode allowing reverse conduction thereof. In the latter case, each switching structure that is unidirectional in voltage and current, provided with at least one control electrode and associated in the crystal with a diode allowing reverse conduction thereof, is for example selected from the group of structures comprising reverse-conducting insulated gate bipolar transistors and transistors of the VD-MOS type.

The present invention also relates to a rectifier bridge, characterized in that it comprises a common-anode commutation cell according to the invention and a common-cathode commutation cell according to the invention.

The present invention also relates to a power inverter bridge, characterized in that it comprises a common-anode commutation cell according to the invention and a common-cathode commutation cell according to the invention.

Finally, the present invention also relates to a power switch that is bidirectional in current and in voltage, characterized in that it comprises a commutation cell according to the present invention.

Details and advantages of the present invention will become more clearly apparent from the following description, with reference to the attached diagrammatic drawings in which:

DETAILED DESCRIPTION OF THE INVENTION

The present description relates to two novel devices that can be produced monolithically in silicon (Si), or in some other semiconductor material such as silicon carbide (SiC) or gallium nitride (GaN), being in the form of a monolithic tripole.

Figure 1:
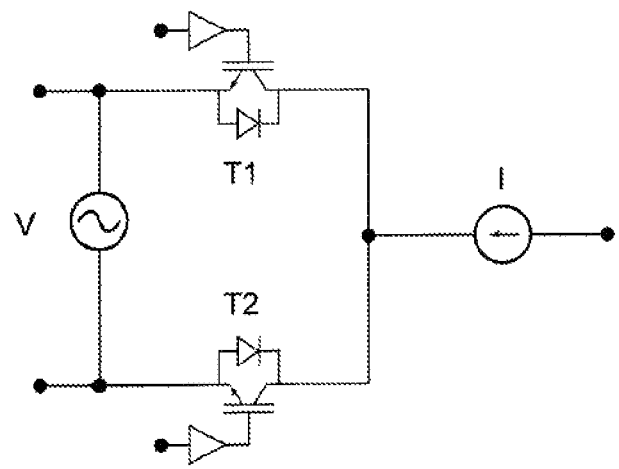
FIG. 1 is a circuit diagram of a common-anode commutation cell.

FIG. 1 shows a first tripole that is in the form of a commutation cell with symmetric topology of the current switch type joining together two transistors T1 and T2. Each of these transistors is, in the embodiment shown, a reverse conducting insulated gate bipolar transistor (RC-IGBT). In the tripole shown in said FIG. 1, the two transistors T1 and T2 have common anodes or rear faces.

As a variant, the transistor could be of a different type. It could for example be a transistor of the VDMOS or VDMOSFET type. VDMOS is an acronym of vertical double-diffused metal oxide semiconductor. VDMOSFET is an acronym of vertical double-diffused metal oxide semiconductor field effect transistor.

Figure 2:
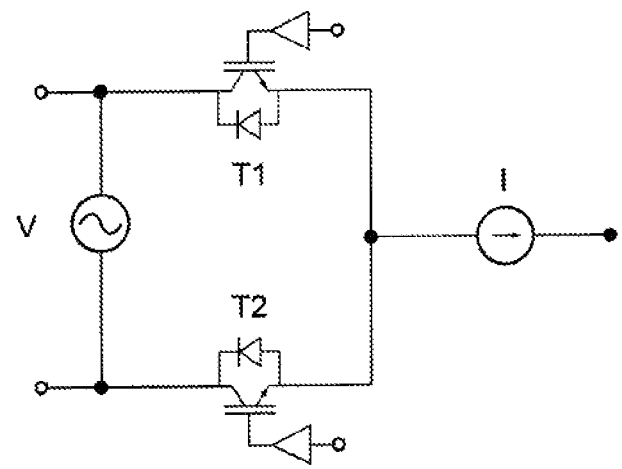
FIG. 2 is a circuit diagram of a common-cathode commutation cell.

A second tripole is shown in FIG. 2. In this case it is a commutation cell with symmetric topology of the current switch type joining together two transistors of the RC-IGBT type, but these transistors T1 and T2 are assembled in such a way that their cathodes, or front faces, are common (they could also be VDMOS or VDMOSFET transistors).

It should be noted that the two tripoles shown in FIGS. 1 and 2 are symmetrical and that they have electrodes of the same type (anode or cathode) in common. These characteristics are utilized so that complete regions of the two insulated gate bipolar transistors or metallization planes can be shared relatively easily and advantageously, to facilitate their integration and develop novel properties.

Figure 3:
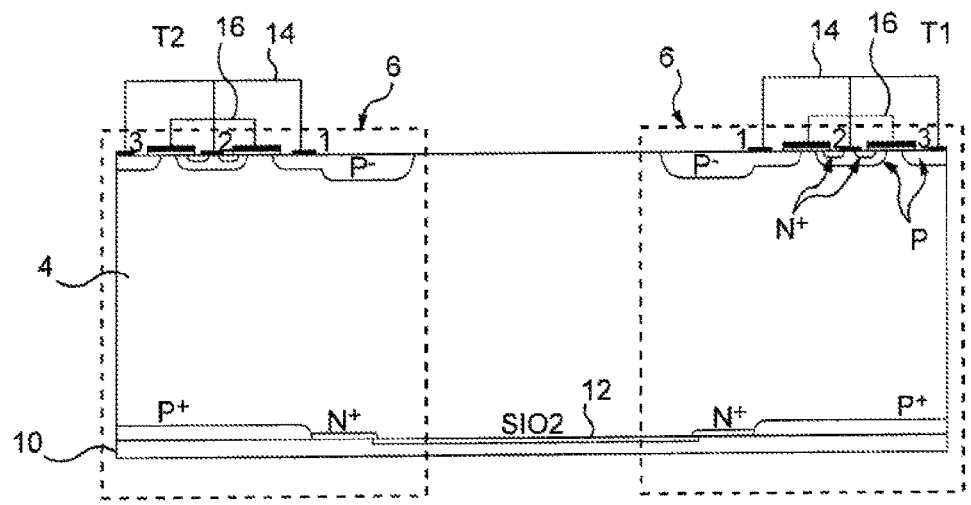
FIG. 3 shows the architecture of a common-anode commutation cell according to the present invention.
Figure 4:
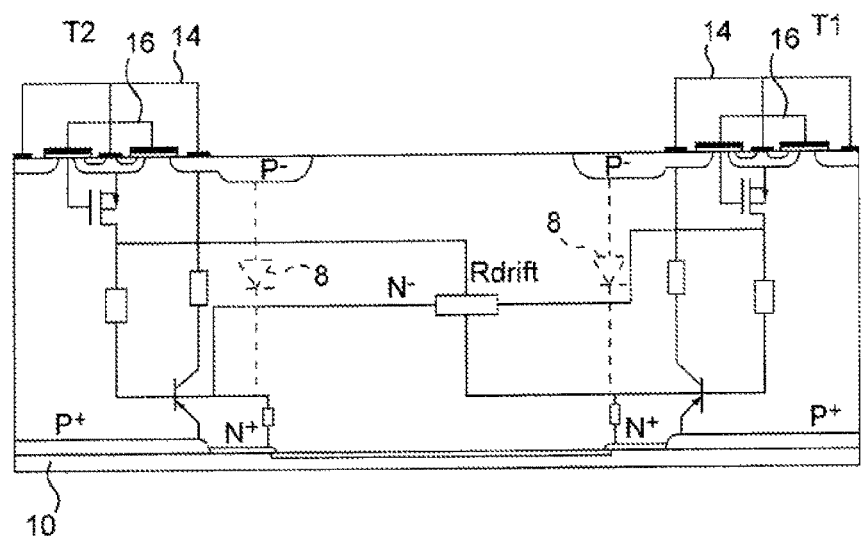
FIG. 4 shows the simplified equivalent circuit diagram of the structure in FIG. 3, showing the behaviour of the cell shown in FIG. 3 from the circuit standpoint.

The tripole, the circuit diagram of which is shown in FIG. 1 can be produced entirely in one and the same semiconductor substrate 4 and for example has the structure shown in FIG. 3. The latter is composed of two reverse-conducting insulated gate bipolar transistor structures (called hereinafter "IGBT structure"). As shown in FIG. 4, which superimposes the corresponding electronic components on FIG. 3, it is noted that each IGBT structure of the structure shown in FIG. 3 integrates within it a PIN diode 8 that provides reverse conduction. Each of these reverse-conducting IGBT structures corresponds to a section 6 shown by a rectangle drawn with broken lines.

The inventors have demonstrated that it is possible for the two reverse-conducting IGBT structures to be accommodated in one and the same silicon chip. Owing to the various interactions that are possible between the two sections 6 of the structure shown in FIGS. 3 and 4 (and 5 as well), interactions that can be a source of malfunction of the integrated overall structure, monolithic integration of two reverse-conducting IGBT structures is not obvious to a person skilled in the art. In this structure, while it is operating, the two sections (each having a reverse-conducting IGBT structure) are always in two different states: one section is in the ON state while the other is in the OFF state.

Figure 5:
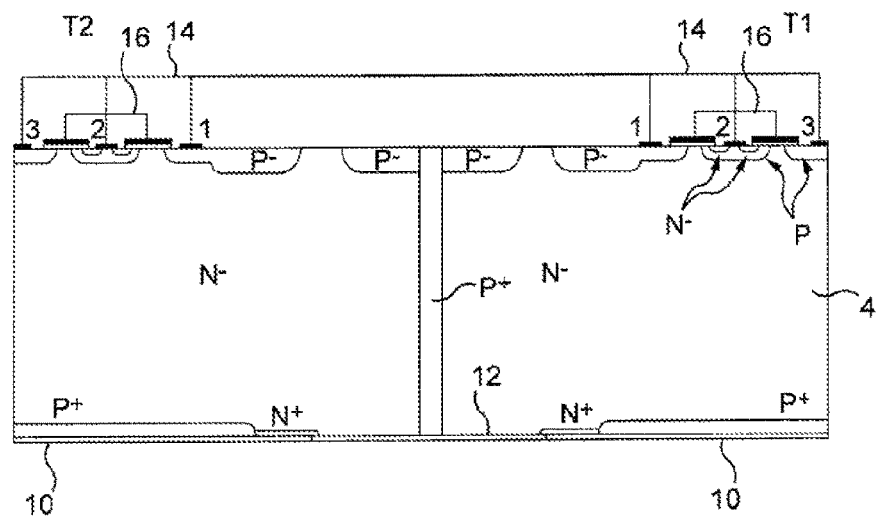
FIG. 5 shows the architecture of a common-cathode commutation cell according to the present invention.

In FIGS. 3 to 5, it will be considered hereinafter that the structure shown comprises a rear face that is arranged at the bottom and a front face arranged at the top. In these figures, an anode is located on the rear face for each of the sections 6 corresponding to a reverse-conducting IGBT structure.

In FIGS. 3 and 4, it will be noted that there are P+ and N+ diffusions at each anode, the N+ diffusion being located on the side with the other anode. These two N+ and P+ diffusions are short-circuited in each case by an anode electrode 10 which is common to the two sections 6. An oxide layer 12, arranged between the two N+ diffusions, makes it possible to isolate the anode electrode from an N− zone of the substrate 4. This separation and the use of oxide make it possible to reduce the interaction between the two sections 6, on the one hand, and reduce the level of anode current necessary to make the rear face P+/N− junction conducting, on the other hand.

On the front face (FIGS. 3 and 4), P− regions are formed at each section 6 and serve to protect the junction curvatures, in the OFF state, from a risk of premature breakdown. The front face corresponds to the face of the cathodes 14 for sections 6. For both cathodes, the electrodes are numbered (1, 2, 3). Electrode 1 is used for fixing the potential of the P− region, which is reverse-polarized in the OFF state.

Correct operation of the integrated structure shown in FIGS. 3 and 4 corresponds to the following two cases:
- left section 6 ON while the right section 6 remains OFF and withstands an applied voltage;
- right section 6 ON while the left section 6 remains OFF and withstands an applied voltage.

Two modes corresponding to reverse conduction could also be added. When one diode conducts, the other remains OFF and withstands a voltage of for example 600 V.

It will be noted that, in the preferred embodiment shown in FIGS. 3 and 4, the structure is symmetrical relative to a vertical plane of symmetry.

As shown in the figures, each of the sections 6 also has two P regions on its front face. A first P region is arranged at the end of the front face and receives the electrode 3. This first P region is separated from the second P region by the N− zone of the substrate, which also separates this second P region from the P− region mentioned above. The second P region integrates two N+ regions provided on the front face. The second P region separates, on the one hand, the two N+ regions from each other and, on the other hand, each of the N+ regions from the N− zone of the substrate 4. Electrode 2 corresponds to the second P region and to the two N+ regions.

As shown in the figures, the front face of the structure also carries a gate 16 for each section 6.

When an insulated gate bipolar transistor of the structure is in its ohmic zone, its homologue must remain OFF. When the transistor is ON, electrons are injected through the MOS channel of the IGBT structure in the ON state in the N− region (which is common to both sections 6). Consequently, the P+ regions located on the rear face of the integrated structure inject holes into the N− zone, also called drift zone, to ensure electrical neutrality. This injection will be greater at the P+/N− junction located on the side of the IGBT structure in the ON state than the P+/N− junction located on the side of the IGBT structure assumed to have remained in the OFF state. Injection in this region must be as low as possible to reduce the leakage current of the IGBT structure in the OFF state. To limit this leakage current, it is possible to adjust the distance separating the two sections 6. Reduction of the quantity of holes collected by the P diffusions located on the front face of the IGBT structure in the OFF state takes place via increasing the value of the resistance $R_{drift}$ (FIG. 4). For further reduction of the quantity of holes collected, it is preferable to use N+ diffusions to reduce the efficiency of injection of the rear-face P+/N− junction of the IGBT in the OFF state.

The configuration of the rear face of the integrated structure leads to two modes of operation in the ON state, a VDMOS mode for a low level of current and an IGBT mode for a high level of current. The origin of the holes collected by the base P of the IGBT structure in the OFF state is the P+ diffusion from the rear face. To reduce the injection of holes by this P+ diffusion, the N+ zone on the rear face makes it possible to put back the level of conduction current of the P+/N− junction to a high level. However, this junction can be made conductive when a section 6 passes from the OFF state to the ON state.

As a non-limitative example, purely for illustration, numerical values are given for the geometric parameters of the two sections 6 of the structure. It is assumed, as mentioned above, that the structure is symmetrical and therefore identical values are found for both sections 6.

| Region | Depth (μm) | Width (μm) | Surface concentration (atoms/cm$^3$) |
|---|---|---|---|
| N+ (anode) | 1 | 30 | $1 \cdot 10^{20}$ |
| N+ (cathode) | 1 | 5 | $3 \cdot 5\ 10^{17}$ |
| N− (uniform doping) | Substrate | Substrate | $1 \cdot 10^{14}$ |
| P+ (anode) | 5 | 264 | $1 \cdot 10^{20}$ |
| P− | 7 | 150 | $5 \cdot 4\ 10^{15}$ |
| P | 5 | — | $5\ 10^{17}$ |

The thickness of the N− zone is for example 300 μm. The total width of the structure is 2.56 mm. The area of each section 6 is 1 cm$^2$.

The integrated structure shown in FIG. 5 uses the same references as the preceding figures to denote similar elements. This figure shows two IGBT structures integrated in a chip. A substrate 4 in this figure thus comprises, on the one hand, a front face on which there are doped regions and electrodes 1, 2, 3 of a cathode 14 as well as an insulated gate 16 and, on the other hand, a rear face with two anodes.

In the embodiment in FIG. 5, there are two separate anode electrodes 10. The two cathodes 14 are electrically connected to each other. A structure similar to that in FIGS. 3 and 4 is then found, the main difference being that in FIGS. 3 and 4 the anodes of the two IGBT structures are common and in FIG. 5 the two cathodes of the IGBT structures are common.

Here there are two reverse-conducting IGBT structures, both similar to the reverse-conducting IGBT structures in FIGS. 3 and 4. In the preferred embodiment shown in FIG. 5, the same symmetry is found with respect to a vertical plane of symmetry.

In the integrated structure in FIG. 5, the two sections corresponding to a reverse-conducting IGBT structure are separated from each other by a wall that goes all the way across the substrate 4, for example of silicon (the same materials can be used here for making the substrate as those mentioned above for the embodiment in FIGS. 3 and 4). In the case of FIG. 5 where the cathodes are common, or more precisely joined together at the surface, application of a potential difference between the two anode electrodes 10 is envisaged. Since the two sections share one and the same N− substrate, material separation between the two sections is then provided between these two sections. It is proposed to materialize this separation with a P+ region separating the N− substrate of the two sections.

On the front face, on each side of the P+ wall, it will be noted that there is a P− region separated from each reverse-conducting IGBT structure by the N− substrate.

On each side of the P+ wall, a structure is found similar to that described above (as can in particular be seen in FIG. 5), and therefore it is not described in detail here. Thus, on the front face P, P+ and N+ doped regions are found as well as electrodes 1, 2 and 3 for each cathode 14 as well as an insulated gate 16. On the rear face, the same structure is that described above is also found, except that the anode electrodes 10 are not connected to each other.

The P− regions in the structure make possible to protect the reverse-polarized junctions from possible premature breakdowns.

As a non-limitative example, purely for illustration, numerical values are given for the geometric parameters of the two reverse-conducting IGBT structures. It is assumed, as mentioned above, that the integrated structure is symmetrical and therefore identical values are found for the two reverse-conducting IGBT structures.

| Region | Depth (μm) | Width (μm) | Surface concentration (atoms/cm$^3$) |
|---|---|---|---|
| N+ rear face | 1 | 18 | $1 \cdot 10^{20}$ |
| N+ (cathode) | 1 | 5 | $3 \cdot 5 \, 10^{17}$ |
| N− (uniform doping) | Substrate | Substrate | $1 \cdot 10^{14}$ |
| P+ rear face | 5 | 464 | $1 \cdot 10^{20}$ |
| P− | 7 | 150 | $5 \cdot 4 \, 10^{15}$ |
| P | 5 | — | $5 \, 10^{17}$ |
| P+ | Substrate | 10 | $1 \cdot 10^{20}$ |

As for the example in FIGS. 3 and 4, for example a thickness of the N− zone of 300 μm can be selected. The total width of the structure is 2.56 mm. The area of each reverse-conducting IGBT structure is 1 cm$^2$. A current of 100 A can pass through each reverse-conducting IGBT structure, and the reverse-polarized junction of an IGBT section that is in the OFF state can withstand 600 V. This voltage is applied between the two anode electrodes 10.

Studies and simulations conducted on the two integrated structures shown in FIGS. 3 to 5 showed that these structures are able to function under conditions usually encountered in the field of power electronics.

The description that has just been given shows in each case two reverse-conducting IGBT structures assembled within one and the same chip. It is also possible to produce a star circuit using a larger number of reverse-conducting IGBT structures on one and the same chip. It is thus possible to envisage having three, four, etc. integrated IGBT structures with their common anodes (or cathodes) on one and the same chip.

Figure 6:
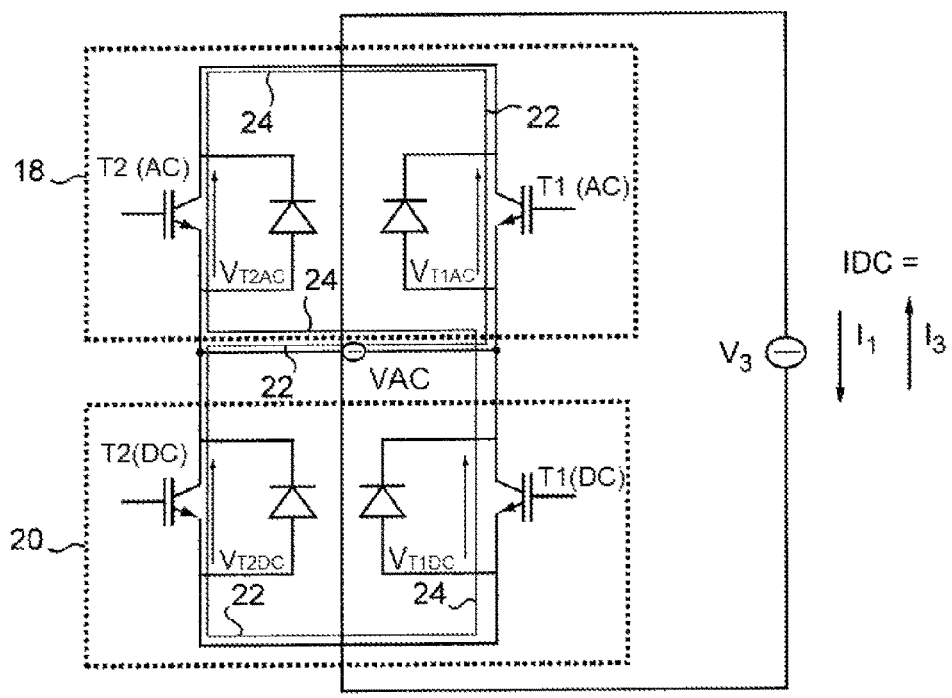
FIG. 6 is a circuit diagram of a rectifier bridge according to the present invention.

An application of the common-anode and common-cathode architectures is shown in FIG. 6, which shows a rectifier bridge obtained by associating, for example by the technique of assembly by microhybridization (also known as "chip-on-chip"). This association makes it possible to exploit the current switching capacities of the commutation cells according to the invention, such as the commutation cells shown in FIGS. 3 to 5, as well as their bidirectional characteristics in respect of current and voltage, for example for energy conversion applications.

The purpose of a rectifier bridge rectifier, for example that shown in FIG. 6, is to transform the power from alternatively or AC networks into power in direct-current form. By combining two chips such as those shown in FIGS. 3 and 5, it is possible to synthesize a rectifier component that is reversible in respect of current.

FIG. 6 shows, at the top, a common-anode chip 18, the contour of which is shown diagrammatically with dotted lines, and at the bottom of this figure, a common-cathode chip 20.

Each chip comprises an insulated gate bipolar transistor T1 and T2. The transistors of the common-anode chip 18 have an AC voltage $V_{T1AC}$ and $V_{T2AC}$ at their terminals whereas those of the common-cathode chip 20 have a DC voltage $V_{T1DC}$ and $V_{T2DC}$.

Each insulated gate bipolar transistor receives command signals, called respectively T1(AC) and T2(AC) for the common-anode chip 18 and T1(DC) and T2(DC) for the common-cathode chip 20. The cells (or transistors) arranged diagonally relative to each other receive identical command signals. Therefore T1(AC)=T2(DC) and similarly T2(AC)=T1(DC).

Between the common-anode chip 18 and the common-cathode chip 20 there is a voltage generator VAC.

The path of the current is shown diagrammatically by line 22 in FIG. 6 when the (AC) voltage of the generator VAC is positive and by line 24 when this voltage is negative.

The command voltages are applied between the gate and the emitter of each cell. This is for example an overlap control so that it will then be possible to use the insulated gate bipolar transistors in circuit-breaker mode.

Commutation takes place when the voltage of generator VAC passes through the value 0, with a short time of the order of 10 μs (overlap) during which both cells of one and the same chip conduct.

To validate the operation of this rectifier, a current passing from 100 A to −100 A was injected in order to verify its reversibility in respect of current and it was then found that reversal of the current did not affect the performance of the rectifier bridge, which can therefore function in both directions of the current.

Figure 7:
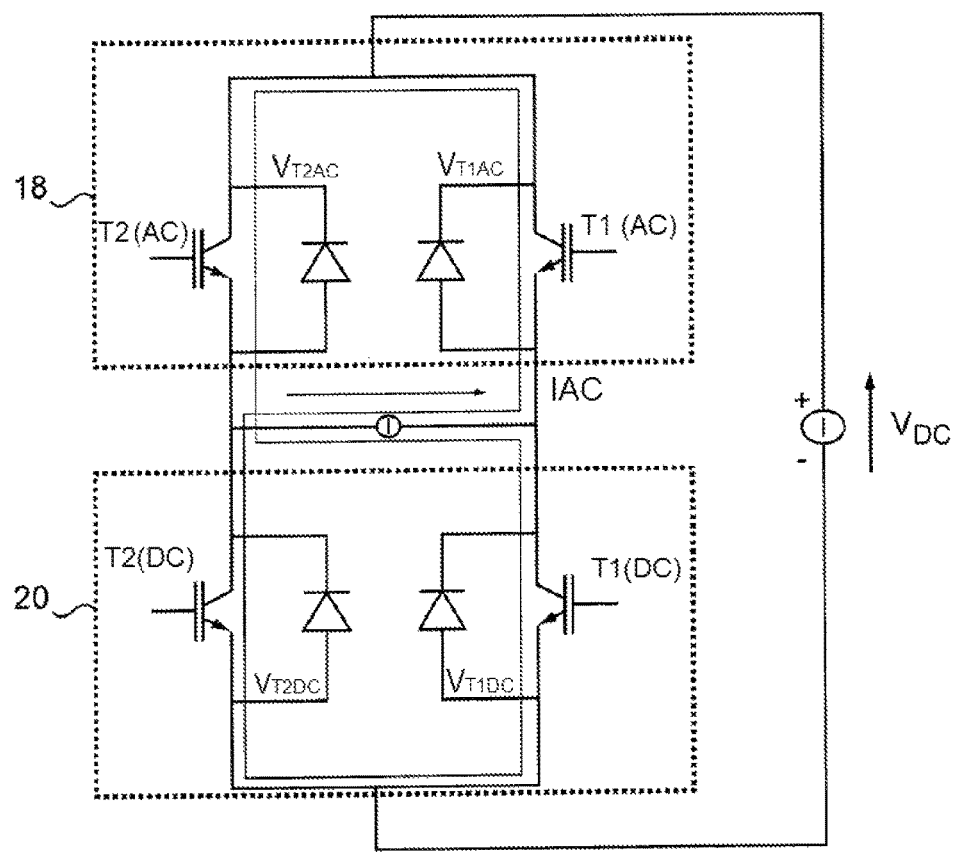
FIG. 7 is a circuit diagram of a power inverter bridge according to the present invention.

Another application of the present invention is shown in FIG. 7, which shows an inverter bridge. The latter resembles the rectifier bridge of FIG. 6. The difference lies in the type of signals generated: the DC current of the load in the case of the rectifier bridge and the generator AC voltage becomes a source of alternating current. Just as for the rectifier bridge, the diagonal cells have the same command signals but in the case of the inverter bridge in FIG. 7, it is proposed here for example that the overlap sequences be replaced with dead-time sequences. During a dead time, all the insulated gate bipolar transistors of the bridge inverter are in the OFF state and during this short space of time the diodes conduct. A dead time of the order of 1 μs can also be envisaged here.

Figure 8:
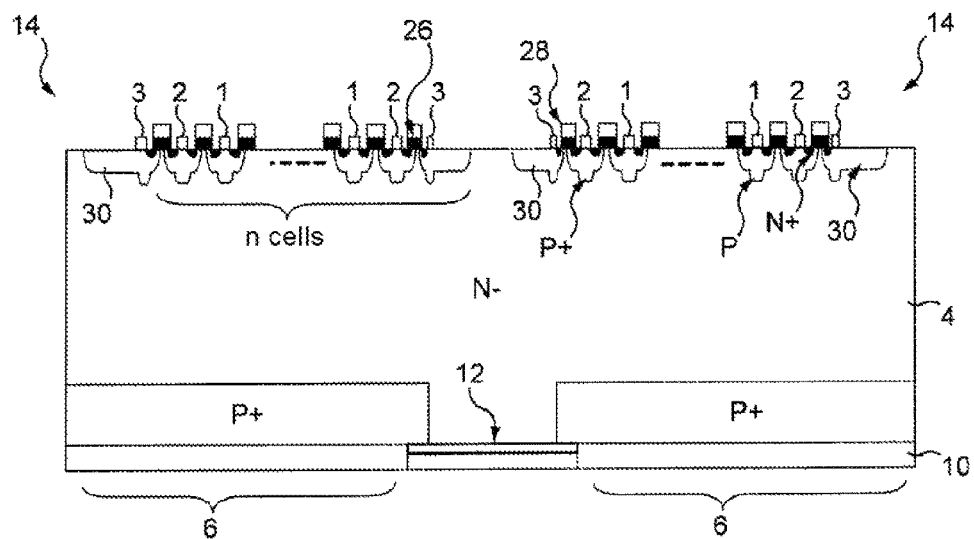
FIG. 8 shows the architecture of a common-anode commutation cell using two transistors of the IGBT type for performing functions of the switching type.

FIG. 8 shows a common-anode commutation cell with a structure similar to that shown in FIG. 3. In this embodiment variant, there are two IGBT structures, each having a cathode 14 and with an anode electrode 10 common to both structures, but the diode function is not present in the embodiment of FIG. 3. At the level of each cathode 14, there are electrodes 1, 2 and 3. In this case, however, there are several groups of electrodes 1, 2, 3 for each cathode 14, which is formed from several cells, only two of which are shown for each of the cathodes 14. However, it would be possible to have a larger number of cells per cathode 14.

Between the electrodes of each cathode 14, it is noted that on the front face there is an oxide layer 26 covered with a metal layer 28, which form the junction between two doped zones of the corresponding cathode. The metal layer 28 could also be made of polysilicon for example. It is also noted that for each cell of the cathodes there is an implanted junction extension 30, also known as a junction termination extension (JTE).

On the rear face, there is a common anode electrode 10 for the two anodes of each of the two sections shown. Relative to FIG. 3, N+ diffusion is not present, but only P+ diffusion, the two P+ diffusions, each corresponding to an anode, being separated from each other by an oxide layer 12.

Figure 9:
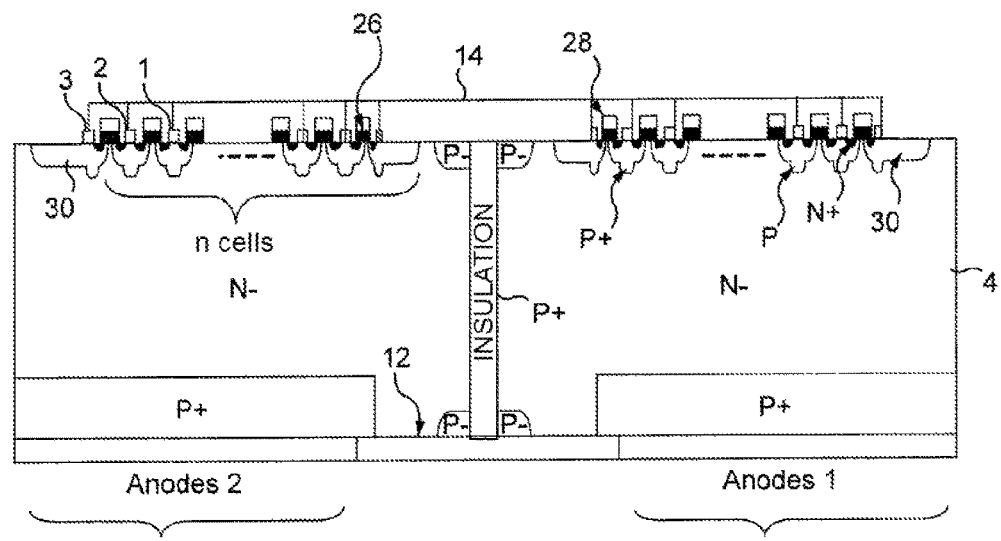
FIG. 9 shows the architecture of a common-cathode commutation cell using two transistors of the IGBT type for performing functions of the switching type.

FIG. 9 shows a common-cathode commutation cell, the structure of which is a combination of those of the commutation cells shown in FIGS. 5 and 8.

The commutation cell in FIG. 9 uses two IGBT structures similar to those shown in FIG. 8 and there is a cathode 14 that is made common to both sections of the cell.

Thus, the structure of the cathodes and anodes is similar to that shown in FIG. 8. There is also, as in FIG. 5, separation between the two sections of the commutation cell provided by a wall that goes all the way across the substrate 4, for example provided by a doping of the P+ type, oxide, silicon, etc. In this case it is proposed to have a P− region on either side of the wall, both on the front face and on the rear face of the commutation cell. On the rear face, there are two anode electrodes 10 separated from each other for example by an oxide layer 12 deposited on the rear face of the substrate 4.

Figure 10:
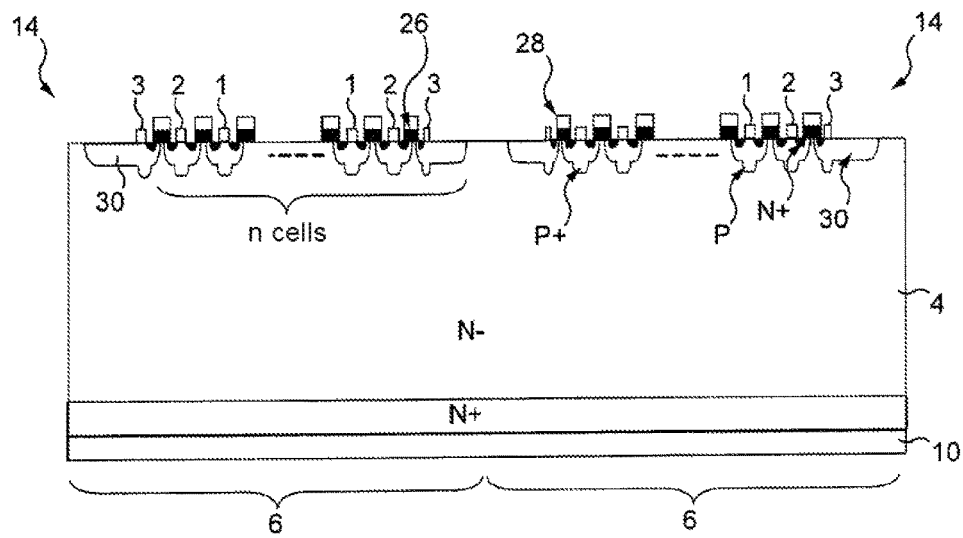
FIG. 10 shows the architecture of a common-anode commutation cell using two transistors of the VDMOS type for performing functions of the switching type.
Figure 11:
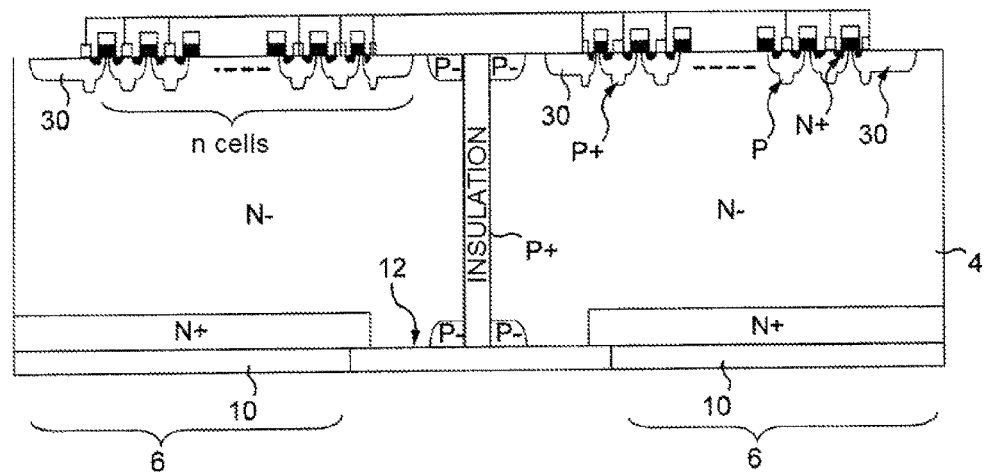
FIG. 11 shows the architecture of a common-cathode commutation cell using two transistors of the VDMOS type for performing functions of the switching type.

FIGS. 10 and 11 show commutation cells that are comparable to those in FIGS. 8 and 9 as they allow the same switching functions to be performed and also unite two sections having a common anode in FIG. 10 and a common cathode in FIG. 11. However, in the embodiment shown in FIGS. 10 and 11, relative to the embodiments in FIGS. 8 and 9, the transistors used are obtained by VDMOS technology (and no longer IGBT). The structures of the cathodes 14 are similar to those shown in FIGS. 8 and 9. On the anode side, it is noted that in the substrate 4 there is an N+ doped layer on the rear face at the level of the anode electrodes 10.

Figure 12:
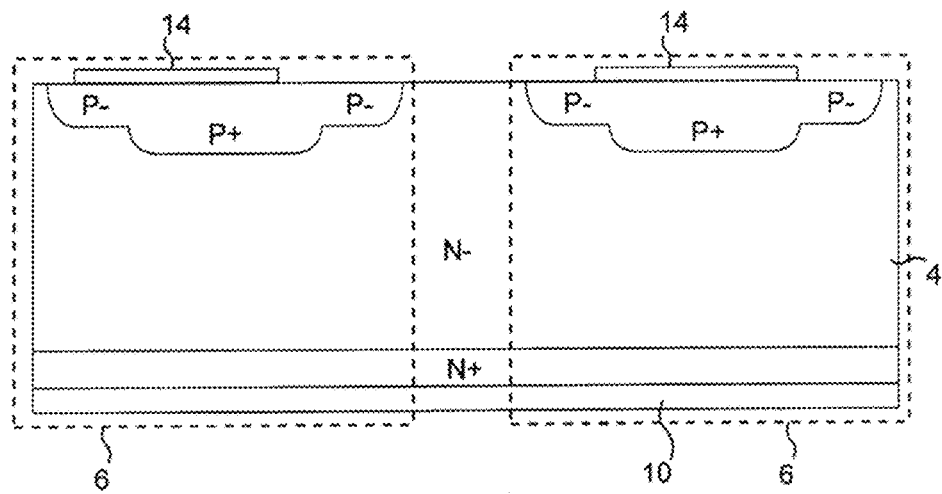
FIG. 12 shows the architecture of a monolithic cell integrating two common-anode diodes.
Figure 13:
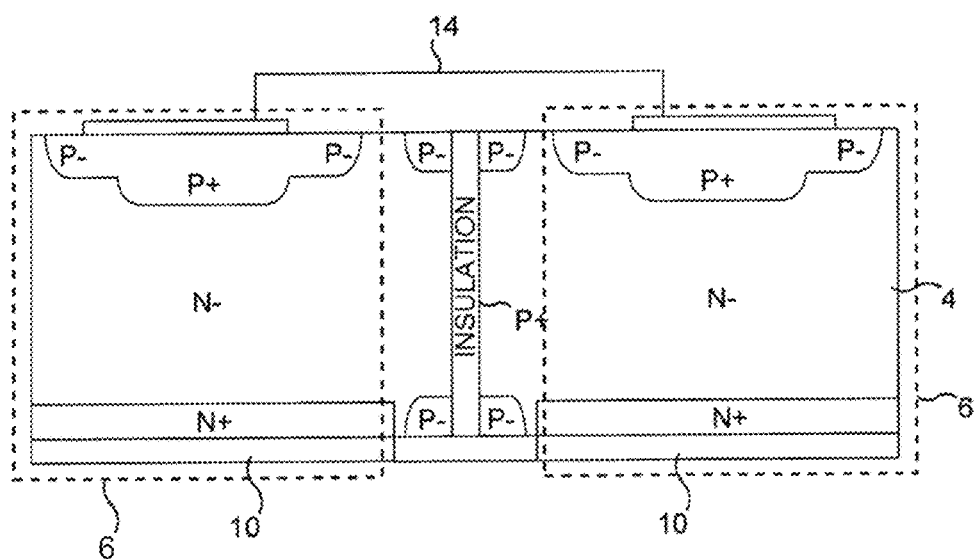
FIG. 13 shows the architecture of a monolithic cell integrating two common-cathode diodes.

FIGS. 12 and 13 show a monolithic cell integrating two diodes. In FIG. 12, the two anodes of the diodes are connected so as to have only one common anode whereas in FIG. 13 the cathodes 14 are connected so as to form a common cathode.

On the front face, the monolithic cells of FIGS. 12 and 13 have P−, P+ and P− doping in succession. The corresponding cathode 14 is arranged both on a P− doped zone and a P+ doped zone. On the rear face, substrate 4 comprises an N+ doped layer at the level of the anode electrodes 10 (FIGS. 12 and 13). In FIG. 13, there is a wall similar to that shown for example in FIGS. 9 and 11.

Figure 14:
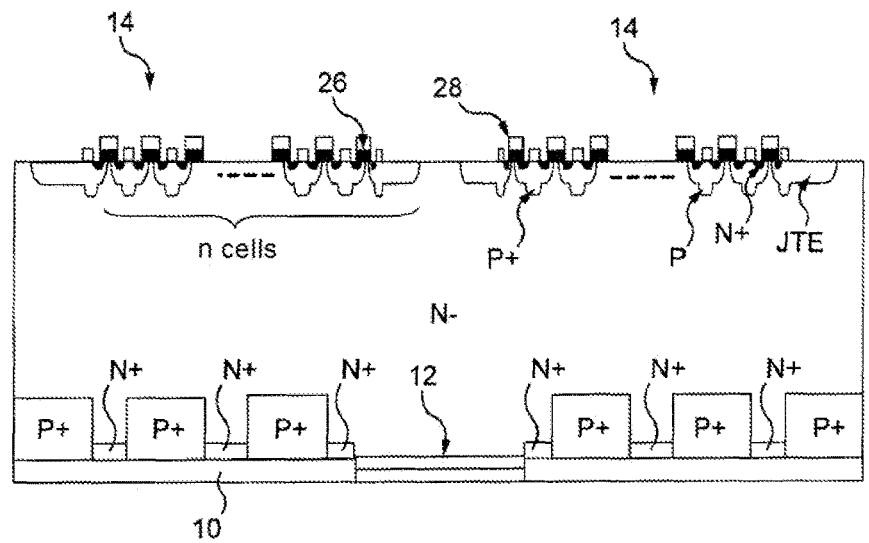
FIG. 14 shows integration of the diode function on the architecture shown in FIG. 8.
Figure 15:
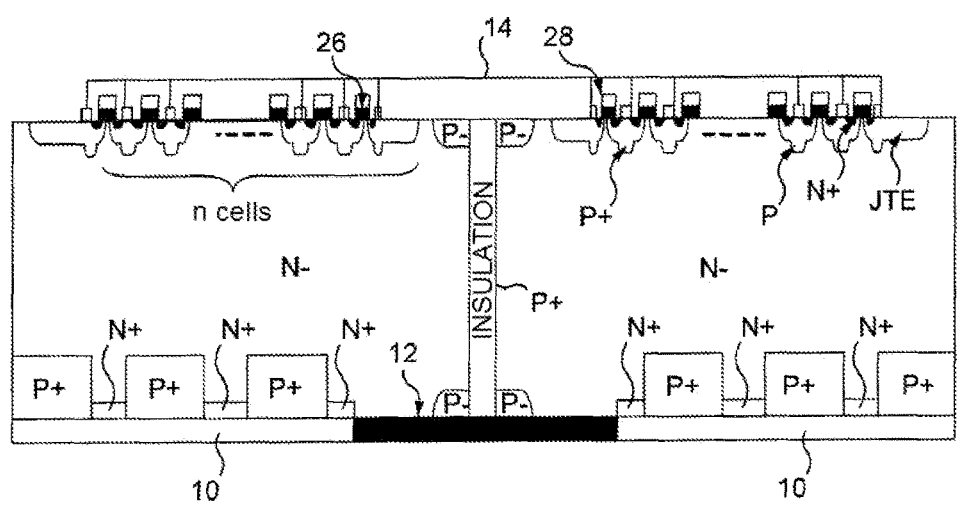
FIG. 15 shows integration of the diode function on the architecture shown in FIG. 9.

FIGS. 14 and 15 show a combination respectively of FIGS. 8 and 12, on the one hand, and of FIGS. 9 and 13, on the other hand. The commutation cells shown in these two FIGS. 14 and 15 in each case combine the switch and diode functions. In FIG. 14 there is a common anode and in FIG. 15, the cathode is made common.

Figure 16:
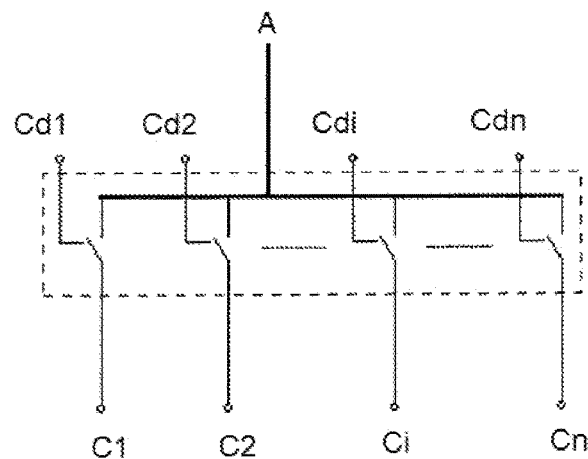
FIG. 16 is a circuit diagram corresponding to the architecture in FIG. 8 with optionally more than two structures.

FIG. 16 shows a circuit diagram of several switches, the anodes A of which are made common. These are controlled switches comprising commands Cd1, Cd2, ..., Cdi, ..., Cdn. When n=2, the circuit diagram in FIG. 16 corresponds to the structures in FIGS. 8 and 10. In FIGS. 8 and 10, if n>2, it is sufficient to juxtapose sections 6 alongside those already shown. Then n cathodes 14 and n anodes are obtained, with a common anode electrode 10.

Figure 17:
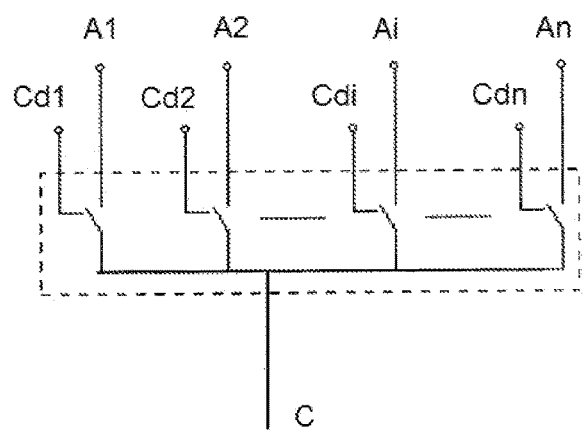
FIG. 17 is a circuit diagram corresponding to the architecture in FIG. 9 with optionally more than two structures.

FIG. 17 shows a circuit diagram of several switches, the cathodes of which are connected as a common cathode C. These are controlled switches comprising commands Cd1, Cd2, ..., Cdi, ..., Cdn. When n=2, the circuit diagram in FIG. 17 corresponds to the structures in FIGS. 9 and 11. In FIGS. 9 and 11, if n>2, it is sufficient to juxtapose sections 6 alongside those already shown. Then n cathodes 14 are obtained, electrically connected and n anodes with a common anode electrode 10. In each case, between two adjacent sections 6, it will be appropriate to provide a wall for example like that shown in each of FIGS. 9 and 11.

Figure 18:
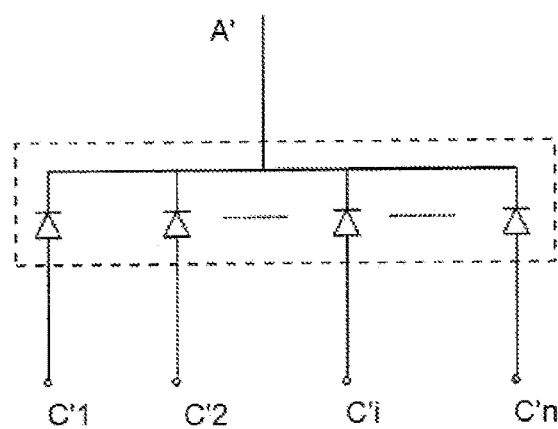
FIG. 18 is a circuit diagram corresponding to the architecture in FIG. 12 but with several diodes.
Figure 19:
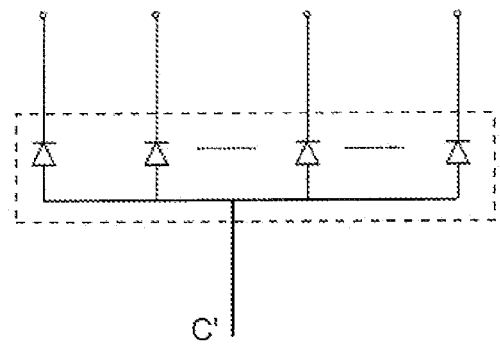
FIG. 19 is a circuit diagram corresponding to the architecture in FIG. 13 but with several diodes.

FIGS. 18 and 19 correspond respectively to the circuit diagrams of the structures of monolithic cells in FIGS. 12 and 13 when n=2. FIG. 18 shows a common anode A' and cathodes C'1, C'2, ..., C'i, ..., C'n, while FIG. 19 shows a common cathode C' and anodes A1, A'2, A'i, A'n.

Figure 20:
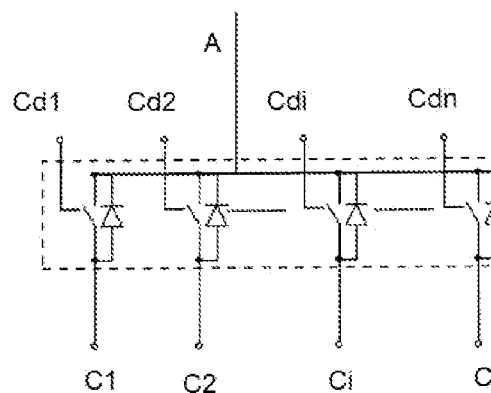
FIG. 20 is a circuit diagram corresponding to the architecture in FIG. 14.
Figure 21:
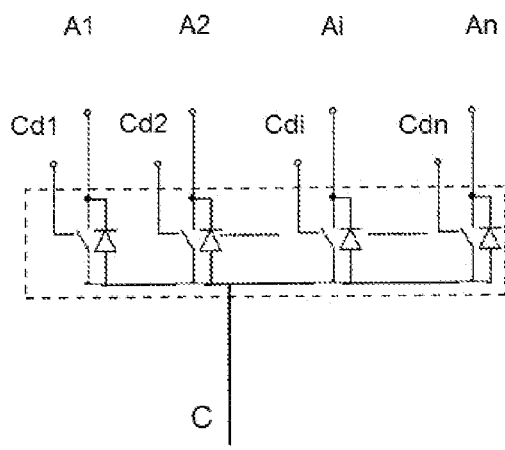
FIG. 21 is a circuit diagram corresponding to the architecture in FIG. 15.

FIGS. 20 and 21 show the circuit diagram respectively of the commutation cells, the structures of which are shown in FIGS. 14 and 15 respectively.

Figure 22:
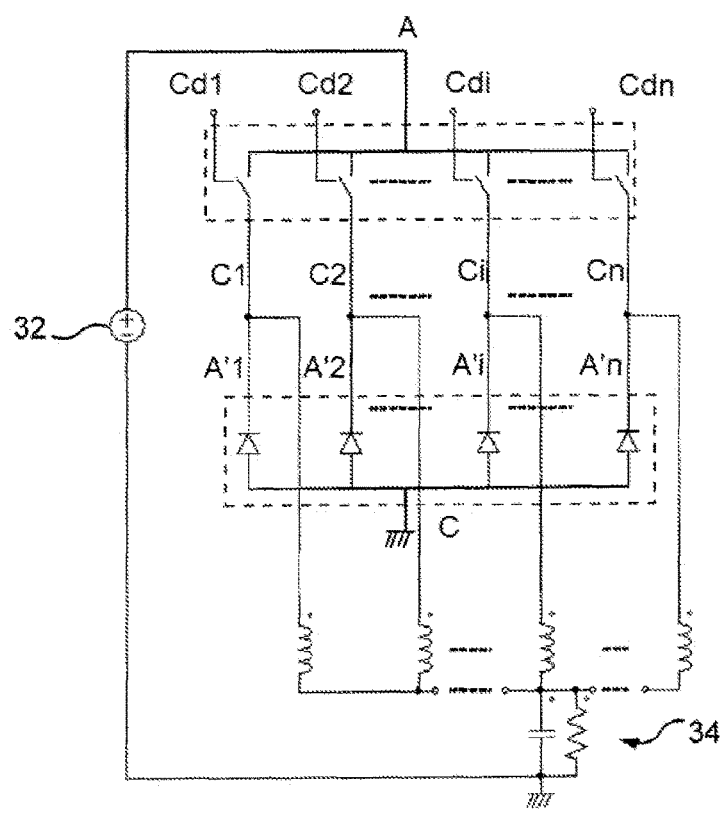
FIGS. 22 and 23 each show a circuit diagram of a DC-DC converter produced on the basis of two monolithic cells according to the present invention, and FIGS. 24 and 25 each show a circuit diagram of a bidirectional switch produced on the basis of a monolithic cell according to the present invention.

FIG. 22 shows, as an example, the use of two monolithic cells according to the present invention. It is proposed here to combine a commutation cell corresponding for example to the structure shown in FIG. 8 or 10 with a cell, the structure of which is shown in FIG. 13. There is here a combination of two cells, the circuit diagrams of which correspond to FIGS. 16 and 19.

The combination shown in FIG. 22 makes it possible to obtain a DC-DC converter for lowering the voltage between a voltage source 32 and a load 34.

Figure 23:
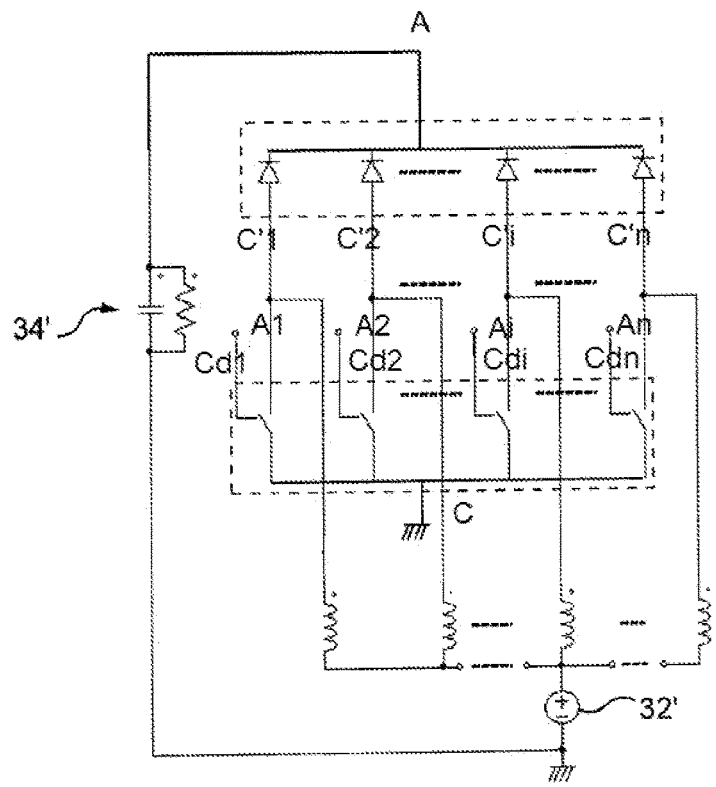

FIG. 23 shows another DC-DC converter for increasing the voltage between a source 32' and a load 34'. This DC-DC converter is obtained in this case by combining a commutation cell, the circuit diagram of which is shown in FIG. 17 with a monolithic cell, the circuit diagram of which is shown in FIG. 18.

Another application of the invention is to produce a power switch that is bidirectional in current and in voltage. In this application, only the two anode electrodes, or the two cathode electrodes, are used, the third electrode remaining floating and inactive. Such a power switch could for example be used to make a relay.

Figure 24:
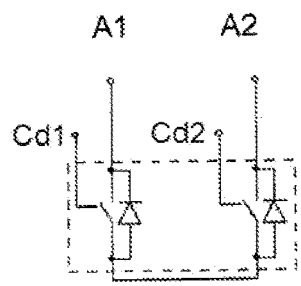
Figure 25:
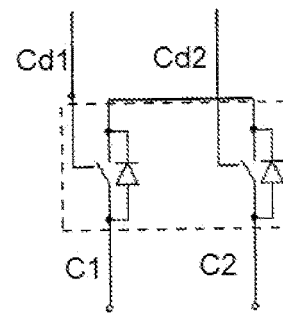

FIGS. 24 and 25 show particular applications of a commutation cell of this type corresponding to the embodiment in FIGS. 15 and 14 respectively (circuit diagrams 21 and 20 with n=2). It is proposed in this case to use only two anodes (A1 and A2 in FIG. 24) or else only two cathodes (C1 and C2 in FIG. 25) out of the three that are available for producing a switch that is bidirectional in voltage and in current. A switch that can perform chopping on alternating current is then obtained.

The present invention thus provides novel switching devices, or reversible current switches. An embodiment has two reverse-conducting, common-anode insulated gate bipolar transistors and the other embodiment has two reverse-conducting, common-cathode insulated gate bipolar transistors. These two embodiments—and variants thereof that are within the reach of a person skilled in the art—are each in the form of a monolithic tripole fully integrated within one and the same chip. Embodiments of a simpler structure can also be produced with the present invention. The cells produced can be used alone (for example as a bidirectional switch) or else in combination (production of a converter for example). In all cases, application of the present invention allows greater integration and therefore further miniaturization of components used in power electronics. Limited wiring is required, making it possible to increase the reliability of the circuits produced and lower the cost thereof.

Studies that have been conducted have shown good operation of these novel structures that are innovative in respect of their lateral breakdown voltage withstand and their very low leakage currents through the parasitic transistors, whatever the sign of the current.

The present invention also relates to a rectifier bridge and an inverter bridge obtained by combining two current switches according to the invention, which are associated by their faces having two electrodes (not connected). The configuration of the control instructions then makes it possible to obtain good operation of these rectifiers and inverters.

Of course, the present invention is not limited to the embodiments described above and the variants mentioned. It also relates to all the embodiment variants within the reach of a person skilled in the art and within the scope of the claims given below.

The invention claimed is:

1. Integrated-circuit monolithic cell, comprising at least two semiconductor structures of the same type that are insulated gate bipolar transistor (IGBT) structures and are unidirectional in voltage and in current,
    each structure having an anode (10), a cathode (14) and optionally a gate (16), wherein each structure is associated with a diode allowing reverse conduction thereof;
    said structures are integrated into the volume of one and the same semiconductor substrate (4), said semiconductor substrate comprising a first face and a second face, said second face being opposite the first face;
    on said first face of the semiconductor substrate (4), the cathodes (14) and optionally the gates (16) of said at least two structures are located in each case in a first predetermined zone on said first face;
    the anodes (10) of said at least two structures are located in a second zone on said second face of the semiconductor substrate (4), such that for each structure the second zone of the structure is opposite the first zone;
    the anodes and the cathodes, of the same type having separate structures, are electrically connected to each other; and
    P+ and N+ diffusions are located at each anode of each structure, and
    wherein an oxide layer (12) is arranged between the two N+ diffusions respectively located at each anode of each structure.

2. The cell according to claim 1, wherein the anodes (10) of two adjacent structures are electrically connected in each case.

3. The cell according to claim 2, wherein
    the electrical connection between two adjacent anodes is carried out by metallization of the semiconductor substrate (4) on its second face between the two anodes (10), and
    the semiconductor substrate has an N+ region in the proximity of the metallization and an N− region between the two structures in question.

4. The cell according to claim 1, wherein the cathodes (14) of two adjacent structures are electrically connected in each case.

5. The cell according to claim 4, wherein a vertical insulating wall of the P+ type is made between the two structures.

6. The cell according to claim 1, wherein the semiconductor substrate (4) is of silicon dioxide ($SiO_2$).

7. The cell according to claim 1, wherein each semiconductor structure corresponds to a diode.

8. The cell according to claim 1, wherein each semiconductor structure is a semiconductor switching structure that is unidirectional in voltage and in current.

9. The cell according to claim 8, wherein each structure is provided with at least one control electrode.

10. The cell according to claim 8, wherein each cell is associated in the crystal with a diode allowing reverse conduction thereof.

11. The cell according to claim 10, wherein each switching structure that is unidirectional in voltage and current, provided with at least one control electrode and associated in the crystal with a diode allowing reverse conduction thereof, is selected from the group of structures comprising reverse-conducting insulated gate bipolar transistors.

12. Rectifier bridge, comprising the cell according to claim 2 and a cell wherein the cathodes (14) of two adjacent structures are electrically connected in each case.

13. Inverter bridge, comprising the cell according to claim 2 and a cell wherein the cathodes (14) of two adjacent structures are electrically connected in each case.

14. Power switch that is bidirectional in current and in voltage, comprising the commutation cell according to claim 10.

15. The cell according to claim 9, wherein each cell is associated in the crystal with a diode allowing reverse conduction thereof.

16. An integrated-circuit monolithic cell, comprising:
    a volume of semiconductor substrate (4), said semiconductor substrate volume comprising a first face and a second face, said second face being opposite the first face;
    a first semiconductor structure and a second semiconductor structure integrated into the volume of semiconductor substrate (4), the first and second semiconductor structures each being insulated gate bipolar transistor (IGBT) structures and being unidirectional in voltage and in current,
    the first and second semiconductor structures each having an anode (10) and a cathode (14),
    the cathodes (14) of the first and second semiconductor structures being located in a first zone on said first face,
    the anodes (10) of the first and second semiconductor structures being located in a second zone on said second face, where for each the first and second semiconductor structures, the second zone is opposite the first zone,
    the anodes (10) of the first and second semiconductor structures each comprising a P+ diffusion adjacent a N+ diffusion,
    each of the first and second semiconductor structures being configured as a diode allowing reverse conduction thereof;
    a metallization connecting one of i) the anode of the first semiconductor structure with the anode of the second semiconductor structure so that the first and second semiconductor structures share a common anode, and ii) the cathode of the first semiconductor structure with the cathode of the second semiconductor structure so that the first and second semiconductor structures share a common cathode;

the anodes and the cathodes, of the same type having separate structures, are electrically connected to each other; and P+ and N+ diffusions are located at each anode of each structure; and an oxide layer (12) extending from the N+ diffusion of the first semiconductor structure to the N+ diffusion of the second semiconductor structure, the oxide layer (12) being connected to the N+ diffusion of each of the first semiconductor structure and the second semiconductor structure, the oxide layer (12) isolating the anodes (10) of the first and second semiconductor structures from an N− zone of the substrate volume.

17. The integrated-circuit monolithic cell of claim 16, wherein, each of the first and second semiconductor structures has a gate (16), each gate (16) being located in the first zone on said first face.

18. The integrated-circuit monolithic cell of claim 16, wherein the metallization connects the anode of the first semiconductor structure with the anode of the second semiconductor structure so that the first and second semiconductor structures share the common anode.

19. The integrated-circuit monolithic cell of claim 16, wherein, the metallization is at said second face and connects the anode of the first semiconductor structure with the anode of the second semiconductor structure so that the first and second semiconductor structures share the common anode, and the metallization extends below the oxide layer (12) and below the N+ diffusion of each of the first semiconductor structure and the second semiconductor structure.

20. The integrated-circuit monolithic cell of claim 16, wherein the metallization is at located at said second face and connects the cathode of the first semiconductor structure with the cathode of the second semiconductor structure so that the first and second semiconductor structures share the common cathode.

* * * * *